United States Patent
Sacco et al.

(10) Patent No.: US 12,328,807 B2
(45) Date of Patent: Jun. 10, 2025

(54) VAPORIZER, ION SOURCE AND METHOD FOR GENERATING ALUMINUM-CONTAINING VAPOR

(71) Applicant: NISSIN ION EQUIPMENT CO., LTD., Koka (JP)

(72) Inventors: George Sacco, Groveland, MA (US); Michael Crovo, Saugus, MA (US); Sami K. Hahto, Nashua, NH (US)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 471 days.

(21) Appl. No.: 17/945,705

(22) Filed: Sep. 15, 2022

(65) Prior Publication Data

US 2024/0098869 A1 Mar. 21, 2024

(51) Int. Cl.
*H05H 1/42* (2006.01)
*H01J 27/08* (2006.01)
*H01J 49/10* (2006.01)

(52) U.S. Cl.
CPC .............. *H05H 1/42* (2013.01); *H01J 27/08* (2013.01); *H01J 49/105* (2013.01)

(58) Field of Classification Search
CPC . H05H 1/42; H05H 1/32; H01J 49/105; H01J 49/12; H01J 49/126; H01J 27/08; H01J 37/08
See application file for complete search history.

(56) References Cited

U.S. PATENT DOCUMENTS

| | | | |
|---|---|---|---|
| 5,977,552 A * | 11/1999 | Foad | H01J 27/04 |
| | | | 250/424 |
| 6,452,338 B1 | 9/2002 | Horsky | |
| 6,998,626 B1 | 2/2006 | Ryding et al. | |
| 8,702,920 B2 | 4/2014 | Ikejiri et al. | |
| 10,043,635 B2 * | 8/2018 | Aya | H01J 37/18 |
| 10,087,520 B2 | 10/2018 | Kamenitsa et al. | |
| 10,774,419 B2 | 9/2020 | Kamenitsa et al. | |
| 11,107,659 B2 * | 8/2021 | Murooka | H01J 37/08 |
| 2007/0278417 A1 * | 12/2007 | Horsky | H01J 27/205 |
| | | | 250/427 |

FOREIGN PATENT DOCUMENTS

| | | |
|---|---|---|
| JP | 07-054147 A | 2/1995 |
| JP | 2001-291474 A | 10/2001 |

* cited by examiner

*Primary Examiner* — David E Smith
(74) *Attorney, Agent, or Firm* — Sughrue Mion, PLLC

(57) ABSTRACT

An ion source includes a vaporizer, an arc chamber, and a heat shield. The vaporizer includes a crucible containing an aluminum-containing material and a heater that heats the crucible. The crucible has a gas inlet and a vapor outlet. The arc chamber generates a plasma inside of the arc chamber. The vapor outlet outputs vapor into the arc chamber through a wall of the arc chamber, and the heat shield is provided between the vaporizer and the wall of the arc chamber.

20 Claims, 17 Drawing Sheets

US 12,328,807 B2

VAPORIZER, ION SOURCE AND METHOD FOR GENERATING ALUMINUM-CONTAINING VAPOR

BACKGROUND

1. Field

The present disclosure relates to a vaporizer, an ion source having the vaporizer, and a method for generating aluminum-containing vapor.

2. Description of Related Art

Silicon carbide (SiC) devices are expected to be used in high-voltage and high-temperature applications such as electric vehicles, railways and power plants, and are featured as one of the items to realize a low-carbon society. The manufacturing process for SiC devices is similar to that of conventional silicon devices in that both use an ion implantation process.

In the ion implantation process for SiC devices, nitrogen or phosphorus ions are implanted as an N-type dopant and aluminum or boron ions are implanted as a P-type dopant into a SiC wafer in the production of a PN junction.

However, since there is no stable gas at room temperature for ion implantation of aluminum ions, plasma generation and ion beam extraction based on a solid material containing aluminum are performed. Related art methods of extracting aluminum ions from a solid material cause extraction electrodes to become insulated over time, requiring an additional cleaning process, which results in undesirable downtime of the ion source and thus the ion implanter. A related art "$H_2$ Co-gas" method is available to address the insulation issue, but increases costs because hydrogen gas must be provided.

SUMMARY

According to an aspect of one or more embodiments, there is provided an ion source comprising a vaporizer comprising a crucible containing an aluminum-containing material, the crucible comprising a gas inlet and a vapor outlet, and a heater configured to heat the crucible; an arc chamber configured to generate a plasma therein; and a heat shield, wherein the vapor outlet is configured to output vapor into the arc chamber through a wall of the arc chamber, and wherein the heat shield is provided between the vaporizer and the wall of the arc chamber.

According to another aspect of one or more embodiments, there is provided an ion source comprising a vaporizer comprising a crucible containing an aluminum-containing material that substantially fills an interior of the crucible, the crucible comprising a gas inlet and a vapor outlet, and a heater configured to heat the crucible; and an arc chamber configured to generate a plasma therein, wherein the vapor outlet is configured to output vapor into the arc chamber through a wall of the arc chamber.

According to yet another aspect of one or more embodiments, there is provided an ion source comprising a gas source inlet; a vaporizer comprising a crucible comprising a gas inlet and a vapor outlet, the crucible being cylindrical and extending in a longitudinal direction; a first nozzle that is attached to a distal end of the crucible; an insulator that surrounds at least a portion of the first nozzle, and a coil heater configured to heat the crucible; an arc chamber configured to generate a plasma therein; and a heat shield, wherein the first nozzle comprises a flow path through which a vapor flows from the vapor outlet of the crucible into the arc chamber, the heat shield is provided between the vaporizer and a wall of the arc chamber, the crucible includes a first portion to which the first nozzle is attached, a second portion containing an aluminum-containing material, and a third portion that extends from a proximal end of the second portion in the longitudinal direction to a proximal end of the ion source, and the gas source inlet is in fluid communication with the third portion, the second portion of the crucible has an arc-side portion at a distal end thereof and an inlet-side portion at the proximal end thereof, and the coil heater is disposed around an exterior surface of the inlet-side portion of the crucible and extends in the longitudinal direction beyond the proximal end of the second portion to surround a part of the third portion of the crucible but is not disposed around the arc-side portion of the crucible.

BRIEF DESCRIPTION OF THE DRAWINGS

The above and/or other aspects will become apparent and more readily appreciated from the following description of various embodiments, taken in conjunction with the accompanying drawings, in which.

DETAILED DESCRIPTION

Figure 1:
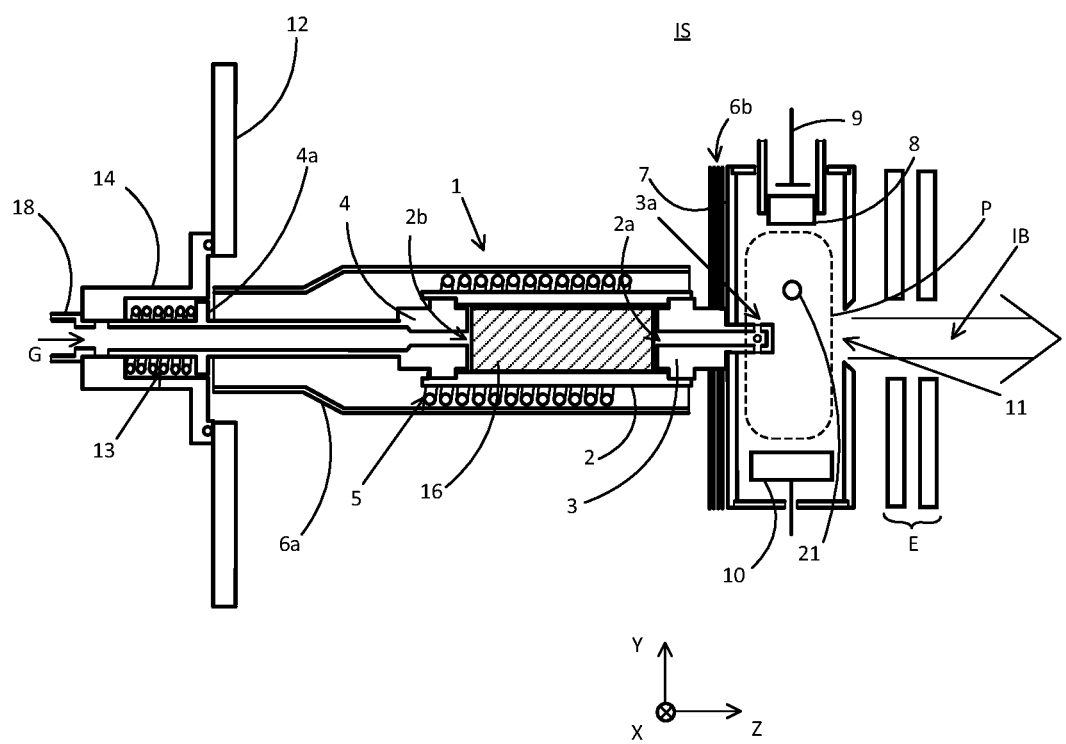
FIG. 1 is a schematic cross-sectional view of an example of an ion source, according to some embodiments.

As discussed above, in the ion implantation process for SiC devices, nitrogen or phosphorus ions are implanted as an N-type dopant and aluminum or boron ions are implanted as a P-type dopant into a SiC wafer in the production of a PN junction.

Nitrogen gas, phosphine, phosphorus trifluoride or boron trifluoride are stable at room temperature. Therefore, nitrogen gas, phosphine, phosphorus trifluoride or boron trifluoride are used to generate plasma, and an ion beam is extracted from the generated plasma for ion implantation of nitrogen, phosphorus or boron ions to a SiC wafer.

On the other hand, since there is no stable gas at room temperature for ion implantation of aluminum ions, plasma generation and ion beam extraction based on a solid material containing aluminum are performed.

For example, some commercial ion implanters use a related art method of generating plasma from an aluminum-containing target, which is a solid material such as aluminum nitride or aluminum oxide.

In the related art method of generating plasma from the aluminum-containing target, the aluminum-containing target is placed in an arc chamber of an ion source. A corrosive gas containing fluorine components, such as, for example, phosphorus trifluoride or boron trifluoride, is supplied into the arc chamber, and a plasma containing fluorine ions and fluorine radicals are generated from the corrosive gas in the arc chamber. Fluorine ions are trapped by a magnetic field in the arc chamber and attracted to a negative electrode near the aluminum-containing target, physically sputtering the aluminum-containing target. Fluorine radicals react chemically with the aluminum-containing target and sputter the aluminum-containing target chemically.

Physical and chemical sputtering releases aluminum particles from the aluminum-containing target. The aluminum particles collide with energetic electrons emitted from a cathode in the arc chamber, producing aluminum ions in the plasma. An ion beam containing aluminum ions is extracted from the plasma by using extraction electrodes, and finally ion implantation of aluminum ions to a SiC wafer is performed.

During an ion source operation, aluminum fluoride ($AlF_3$), a reaction product of fluorine and aluminum, is deposited on the extraction electrodes. This depositing of the reaction product causes the extraction electrodes to become insulated over time. As a countermeasure against extraction electrode insulation, the operation of the ion source is temporarily stopped to remove the deposits from a surface of the extraction electrodes by a variety of related art cleaning methods such as plasma cleaning and/or ion beam cleaning.

Therefore, there is a disadvantage in that uptime (i.e., the running time) of an ion source is decreased due to the insulation of the extraction electrodes. Stated another way, since the ion implanter must be taken offline for cleaning periodically, the downtime of the ion implanter increases. To solve the insulation issue, a related art "$H_2$ Co-gas" method may be used in which hydrogen gas may be introduced into an arc chamber during an ion source operation to remove a fluorine component that causes insulation of the extraction electrodes.

As a result of the supply of hydrogen gas, gaseous hydrogen fluoride (HF) is generated by the reaction of fluorine and hydrogen in the arc chamber. Finally, gaseous hydrogen fluoride is exhausted to an outside of the ion implanter by a vacuum pump. While the related art "$H_2$ Co-gas" method addresses the insulation issue of the extraction electrodes and prevents a decrease in the uptime of the ion source (i.e., prevents downtime of the ion implanter), the related art "$H_2$ Co-gas" method requires an additional hydrogen gas, and thus increases cost.

FIG. 1 shows a schematic cross section of an example of an ion source IS, according to some embodiments. The ion source IS is illustrated as an indirectly heated cathode (IHC) ion source by way of example. A filament 9 heats a cathode 8 and the cathode 8 emits ionizing electrons inside of an arc chamber 7. A reflecting electrode 10 is positioned opposite the cathode 8 to repel electrons from the cathode 8. An external electromagnet, which is not shown in FIG. 1, generates a magnetic field along a direction connecting the cathode 8 and the reflecting electrode 10.

Aluminum-containing vapor is supplied to the inside of the arc chamber 7 from a vaporizer 1. A plasma P is generated based on the aluminum-containing vapor in the arc chamber 7. An ion beam IB containing aluminum ions is extracted by extraction electrodes E through an aperture 11 of the arc chamber 7. While two extraction electrodes E having an aperture respectively are illustrated in FIG. 1, the number of extraction electrodes E is exemplary. In some embodiments, the number of extraction electrodes may be more or less than two. Generally, the number of the extraction electrodes may be changed depending on a configuration of the ion source. The vaporizer 1 is equipped with a crucible 2 in which an aluminum-containing material 16 is placed.

The crucible 2 illustrated in FIG. 1 is a cylindrical member that is longer in one direction. For example, as shown in FIG. 1, an axis of the crucible 2 may extend along a longitudinal direction (e.g., the Z-axis direction in FIG. 1). One end of the crucible 2 in the longitudinal direction has a vapor outlet 2a for supplying aluminum-containing vapor to the arc chamber 7, and the other end of the crucible 2 in the longitudinal direction has a gas inlet 2b to deliver a chlorine containing gas into the crucible 2. In some embodiments, the chlorine containing gas may be, for example, a chlorine gas ($Cl_2$) or hydrogen chloride gas (HCl).

In some embodiments, a first nozzle 3 and a second nozzle 4 may be removably attached to the crucible 2. The first nozzle 3 and the second nozzle 4 are respectively a roughly elongated cylindrical member. In some embodiments, the first nozzle 3, the second nozzle 4, and the crucible 2 may be made of graphite. However, graphite is only an example and, in some embodiments, another material may be used. The second nozzle 4 includes a portion located on the opposite end of the crucible 2 from the first nozzle 3, and a long cylindrical portion that extends in the −Z axis direction to the end of the ion source IS. Various methods (e.g., fitting and/or screwing) may be used to attach the first nozzle 3 and the second nozzle 4 to the crucible 2. The first and second nozzles 3 and 4 are used to extend a vapor outlet 2a and a gas inlet 2b of the crucible 2.

In FIG. 1, arrow G denotes a flow of a supply of chlorine containing gas. The chlorine containing gas passes through the second nozzle 4, the crucible 2, and the first nozzle 3 and into the arc chamber 7, in that order. In the crucible 2, the chlorine containing gas reacts with the aluminum-containing material 16 that is heated to a high temperature to generate aluminum-containing vapor including aluminum chloride ($AlCl_3$) and other aluminum particles. The aluminum-containing vapor and chlorine containing gas are fed from crucible 2 to arc chamber 7 through the first nozzle 3.

In some embodiments, the aluminum-containing material 16 may be in the form of a powder, pellets, and/or a block. In the case in which the aluminum-containing material 16 is provided in the form of a block, the aluminum-containing material 16 may have a plurality of pores so that a chemical reaction with the chlorine containing gas may be increased, since the chemical reaction depends on a size of a contact area between the chlorine containing gas and the aluminum. In some embodiments, the aluminum-containing material 16 may be, for example, pure aluminum, aluminum nitride, or aluminum oxide, or other aluminum containing materials including a powder.

In some embodiments, the aluminum-containing material 16 may be pure aluminum. Pure aluminum increases an aluminum ratio of the aluminum-containing vapor, and also increases an ion beam current of the ion beam extracted from the ion source IS. However, embodiments are not limited to pure aluminum, and in some embodiments, aluminum nitride, aluminum oxide and/or other solid aluminum containing materials may be used.

The supply of chlorine containing gas G to the second nozzle 4 may be done through a gas source inlet 18 fitted inside of the second nozzle 4, as shown in FIG. 1. For example, in some embodiments, the chlorine containing gas G may be supplied from a gas source configured to supply the chlorine containing gas. The specific configuration of the gas source is not particularly limited as long as the gas source is capable of supplying a chlorine containing gas to the gas source inlet 18. In some embodiments, the crucible 2, the first nozzle 3, the second nozzle 4 and other components that serve as flow paths for chlorine containing gas may be made of corrosion-resistant carbon materials.

The end portion 3a of the first nozzle 3, opposite from an end of the first nozzle 3 attached to the crucible 2, protrudes into the arc chamber 7. The end portion 3a has holes for vapor supply in four orthogonal directions so that aluminum-containing vapor may be diffused and supplied in multiple directions inside of the arc chamber 7.

A coil heater 5 with a thermocouple is wound around a periphery of crucible 2. The aluminum-containing material 16 is heated to a high temperature by the heater 5 and reacts with the chlorine containing gas to generate the aluminum-containing vapor. A first heat shield 6a is placed around a periphery of the heater 5 to block heat radiation from the heater 5.

During operation, as the coil heater 5 heats the crucible 2 and thus the aluminum-containing material 16 within the crucible 2, the temperature within the crucible 2 may vary from an ion source end of the crucible 2 (i.e., an end at which the second nozzle 4 is provided) to an opposite end of the crucible 2 (i.e., an end at which the first nozzle 3 is provided) due, at least in part, to heat that is generated by the arc chamber 7 and transferred to an end of the crucible 2 near the arc chamber 7. For example, in some cases, the temperature difference may be about 125 degrees C. The variance of the temperature from one end of the crucible 2 to the other end of the crucible 2 causes the vapor supply from the vaporizer 1 to the arc chamber 7 to become unstable. In some embodiments, the temperature may be controlled by a thermocouple installed at an end of the coil heater 5. However, even with crucible temperature control based on a temperature measured by the thermocouple, the crucible temperature control is not concise due to the large temperature difference from one end of the crucible 2 to the other end of the crucible 2 as discussed above. Therefore, it becomes difficult to achieve a stable vapor supply from the vaporizer 1 to the arc chamber 7.

Accordingly, in some embodiments, the ion source IS may be provided with a second heat shield 6b as illustrated in FIG. 1. The second heat shield 6b may be provided between the crucible 2 and a side wall of the arc chamber 7 that faces the crucible 2, and may extend radially outward from the first nozzle 3 and parallel to the side wall of the arc chamber 7. In some embodiments, the second heat shield 6b may be secured by screws or other fittings. The second heat shield 6b may function to prevent heat from the arc chamber 7 from heating the end of the crucible 2 that is near the arc chamber 7.

Figure 2:
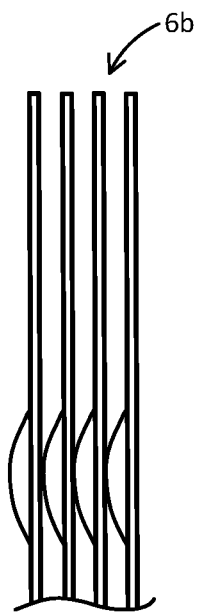
FIG. 2 is a schematic cross-section view of a heat shield of the ion source, according to some embodiments.

FIG. 2 illustrates the second heat shield 6b, according to some embodiments. In some embodiments, the second heat shield 6b may comprise a plurality of heat shield plates. For example, in some embodiments, four heat shield plates may be provided. However, this is only an example, and the number of heat shield plates may be varied. In some embodiments, each of the heat shield plates may extend parallel to the side wall of the arc chamber 7. In some embodiments, the heat shield plates may be spaced apart from one another with a gap in between adjacent heat shield plates. The gaps between the plates block heat transfer from the arc chamber 7 and allows for a larger thermal gradient. In some embodiments, each heat shield plate may be provided with one or more bumps or protrusions in order to space the heat shield plates from one another. The number of heat shield plates is not particularly limited, but each added heat shield plate increases the thermal gradient.

In some embodiments, the second nozzle 4 may have a large diameter section 4a. In some embodiments, a flange 14 may be provided to attach the vaporizer 1 to an ion source flange 12. A coil spring 13 may be provided between the flange 14 and the large diameter section 4a of the second nozzle 4. The coil spring 13 forces vaporizer 1 against a side wall of the arc chamber 7 to prevent aluminum-containing vapor and/or chlorine containing gas from leaking out between the first nozzle 3 and the arc chamber 7. In some embodiments, one or more gaskets (not shown) may also be provided between the vaporizer 1 and the side wall of the arc chamber 7 to prevent gas leakage between the first nozzle 3 and the arc chamber 7, and/or one or more gaskets (not shown) may be provided between the vaporizer 1 and the second heat shield 6b to prevent gas leakage between the vaporizer 1 and the second heat shield 6b. In some embodiments, a damper, for example, a spring clip in the form of a snap ring, may be attached to the first nozzle 3 in order to avoid excess pressure by the elastic force of the coil spring 13. In still other embodiments, a damper, for example, a spring clip, may be provided between the large diameter section 4a of the second nozzle 4 and the inner wall of the heat shield 6a in order to prevent the excess pressure by the elastic force of the coil spring 13. In some embodiments, one or all of one or more gaskets, a snap ring, and/or a spring clip may be provided. It is noted that the gaskets, snap ring and spring clip are only examples and, in other embodiments, different or additional structures may be used. The ion source flange 12 also indirectly supports the arc chamber 7 and other components around the arc chamber 7 such as the filament 9 and the cathode 8 by supporting parts not shown in FIG. 1.

In some embodiments, the aluminum-containing material 16 may substantially fill the interior of the crucible 2 and chlorine containing gas may move through the crucible 2 through the powder or the pellets, or in the case of an aluminum block, through the pores in the block of the aluminum-containing material 16. Thus, the chlorine containing gas may escape through the aluminum and be reduced.

In other embodiments, the aluminum-containing material may fill only a portion of the interior of the crucible 2. For example, in some embodiments, a top edge of the aluminum-containing material 16 may coincide with a bottom edge of the vapor outlet 2a. In some embodiments, the aluminum-containing material 16 may be a semi-circular material in cross section, and a top edge of the aluminum-containing material 16 may coincide with a bottom edge of the gas inlet 2b. With this configuration, the chlorine containing gas may flow along the surface of the aluminum-containing material 16 rather than through pores in the aluminum-containing material 16 or between pellets of the aluminum-containing material 16, allowing the chlorine containing gas to flow more freely to react with the aluminum-containing material 16. That is, with a configuration in which the aluminum-containing material 16 is provided in a semi-circular cross-section, a reaction between chlorine containing gas and the aluminum-containing material 16 may be accelerated. As example of an aluminum-containing material 16 that is provided in a semi-circular cross-section is illustrated in U.S. application Ser. No. 17/714,491, the entire contents of which being herein incorporated by reference. During operation of the ion source IS, a temperature of the extraction electrodes E becomes around 400-500 Celsius. There are no deposits formed on a surface of the extraction electrodes E, based on aluminum chloride which is main ingredient of aluminum-containing vapor, because the boiling point of aluminum chloride included in aluminum-containing vapor is around 180 Celsius. Therefore, in the ion source IS according to various embodiments described above, the insulation issue with the extraction electrodes E becoming insulated over time and requiring cleaning is avoided. That is, with ion source IS according to various embodiments, it is not necessary to use hydrogen gas in a method such as the "H2 Co-gas" method to avoid the insulation issue of the extraction electrodes E becoming insulated over time as in the related art.

The above description is provided using an example of an IHC ion source. However, an IHC source is only one example embodiment and, in other embodiments, other types of ion sources such as a Bernas ion source and a Radio frequency inductively coupled plasma ion source, etc. may be used as the ion source IS.

Figure 3:
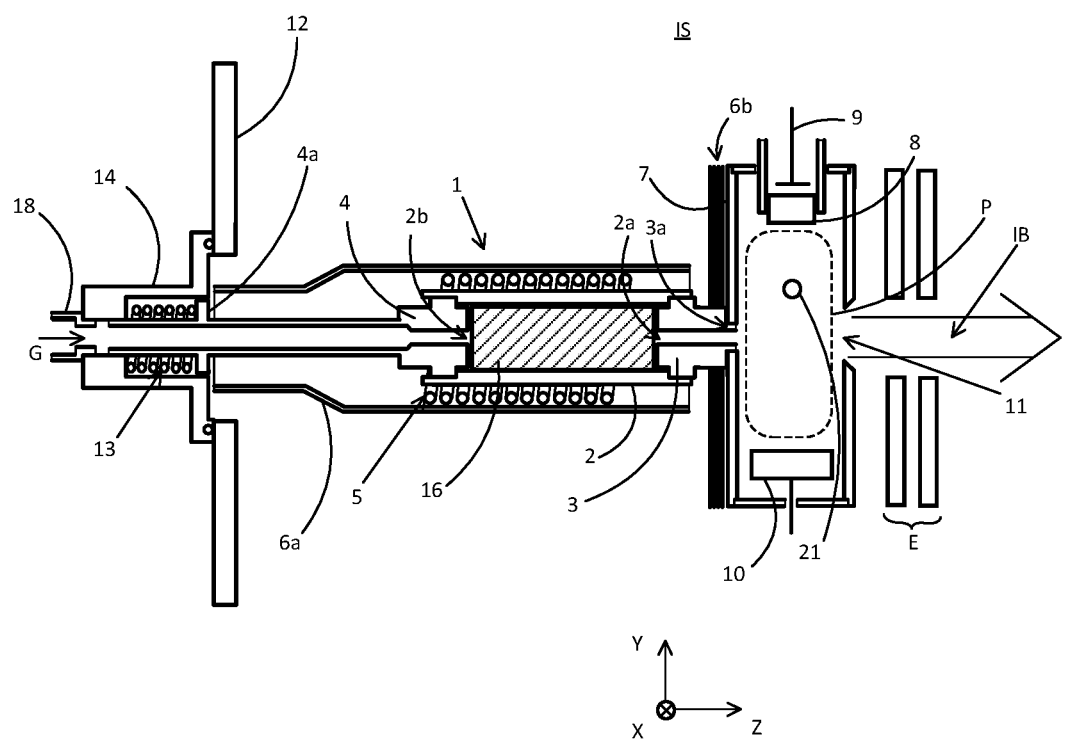
FIG. 3 is a schematic cross-sectional view of another example of an ion source, according to some embodiments.

FIG. 3 is a schematic cross-sectional view of an example of an ion source, according to some embodiments. In FIG. 3, like reference numbers refer to like elements in FIGS. 1-2 and a repeated description thereof is omitted for conciseness. In the configuration described above with reference to FIGS. 1-2, the end portion 3a of the first nozzle 3 protrudes into the arc chamber 7, but this configuration is only an example. In some embodiments, the end portion 3a of the first nozzle 3 may be flush with the wall of the arc chamber 7, as shown in the example of the ion source IS illustrated in FIG. 3. In the configuration illustrated in FIG. 3, the number of apertures H formed in the end 3a of the first nozzle 3 is one in Z direction. In some embodiments, one or more gaskets (not shown) may also be provided between the vaporizer 1 and the side wall of the arc chamber 7 to prevent gas leakage between the first nozzle 3 and the arc chamber 7, and/or one or more gaskets (not shown) may be provided between the insulator 31 (described later) and the arc chamber 7 to prevent gas leakage between the vaporizer 1 and the arc chamber 7.

FIGS. 1 and 3 illustrate examples of an ion source IS in which only one first nozzle 3 and only one second nozzle 4 are provided. However, in some embodiments, multiple inlets, e.g., a plurality of the second nozzles 4 may be provided, for example, by an inlet block in order to enlarge a contact area between the chlorine containing gas and the aluminum-containing material 16. Alternatively or additionally, in some embodiments, a plurality of the first nozzles 3 may be provided, for example, by an outlet block.

Figure 4:
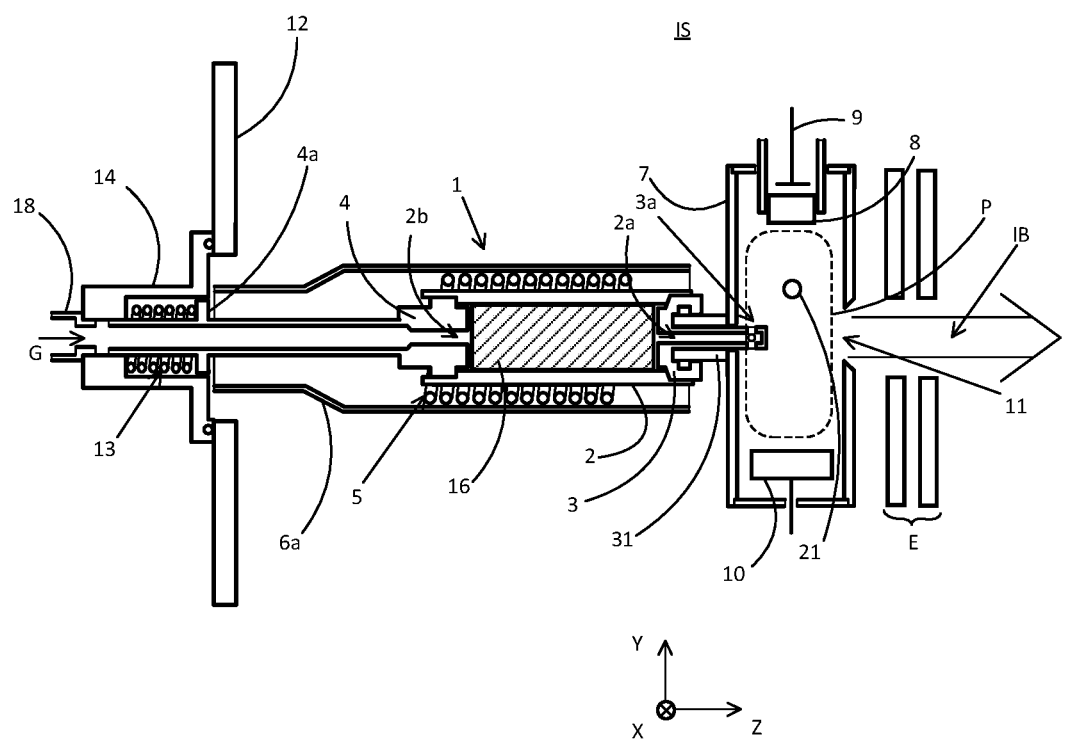
FIG. 4 is a schematic cross-sectional view of an example of an ion source, according to some embodiments.

FIG. 4 is a schematic cross-sectional view of an example of an ion source, according to some embodiments. In FIG. 4, like reference numbers refer to like elements in FIGS. 1-3 and a repeated description thereof is omitted for conciseness.

As discussed above, the heat transfer from the arc chamber 7 to the end of the crucible 2 occurs near the arc chamber 7, there may be a large temperature difference from one end of the crucible 2 to the other end of the crucible 2 such that it becomes difficult to achieve a stable vapor supply from the vaporizer 1 to the arc chamber 7. In some embodiments, the second heat shield 6b may be omitted and the ion source IS may include an insulator 31 that is provided to surround the first nozzle 3 that supplies the aluminum-containing vapor to the arc chamber 7, as illustrated in FIG. 4. In some embodiments, the insulator 31 may be formed of alumina ($Al_2O_3$). In some embodiments, the insulator 31 may be formed of boron nitride (BN). However, the material of the insulator 31 is not limited to these examples and, in some embodiments, another material that provides heat insulation may be used.

The insulator 31 may insulate the first nozzle 3 and the vapor outlet 2a from the heat produced by the arc chamber 7. The insulator 31 may function to prevent heat from the arc chamber 7 from heating the first nozzle 3 and the end of the crucible 2 that is near the arc chamber 7.

Figure 5:
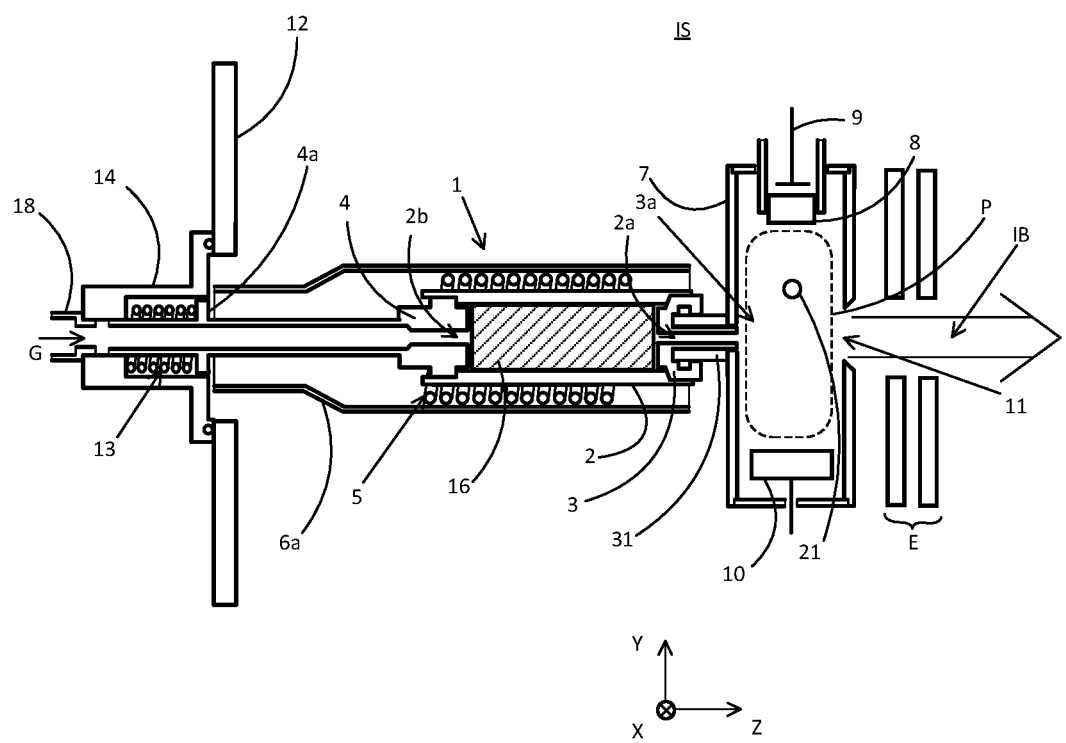
FIG. 5 is a schematic cross-sectional view of an example of an ion source, according to some embodiments.

FIG. 5 is a schematic cross-sectional view of an example of an ion source, according to some embodiments. In FIG. 5, like reference numbers refer to like elements in FIGS. 1-4 and a repeated description thereof is omitted for conciseness. In some embodiments, the insulator 31 may be provided to surround the first nozzle 3 which has the end portion 3a that is flush with the wall of the arc chamber 7, as illustrated in FIG. 5.

Figure 6:
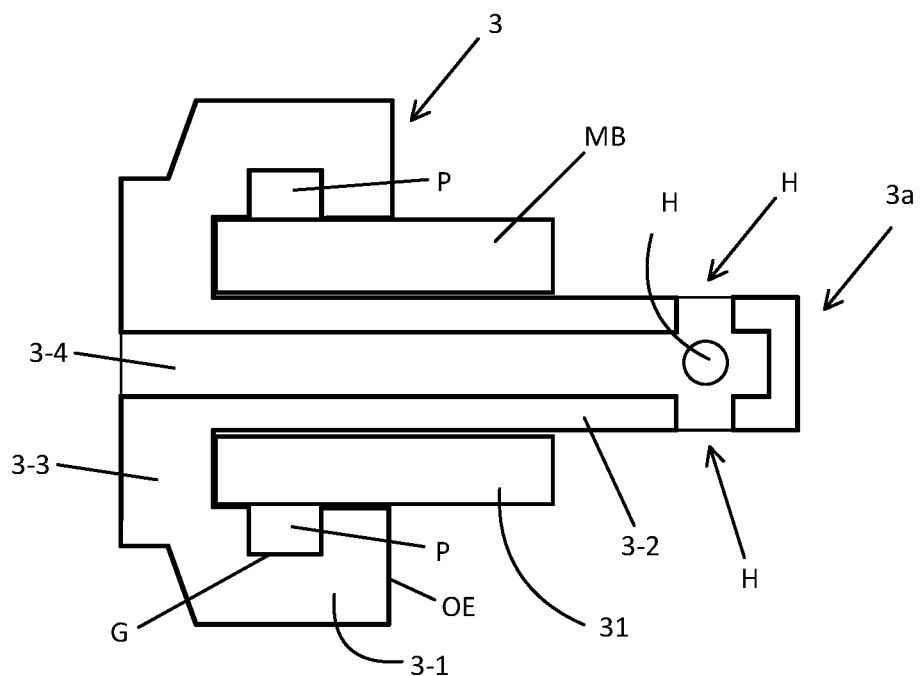
FIG. 6 illustrates an example of a first nozzle of the ion source, according to some embodiments.

FIG. 6 illustrates an example of a first nozzle of the ion source, according to some embodiment. FIG. 6 illustrates a cross-section of an example of the first nozzle 3 of the ion source IS in FIG. 4 in more detail. The first nozzle 3 may have an annular shape symmetrical about a central axis of the first nozzle 3. In some embodiments, the first nozzle 3 may have a first portion 3-1 that includes an annular groove G therein, a second portion 3-2 that extends along a flow path 3-4, and a third portion 3-3 that connects the first portion 3-1 to the second portion 3-2. The flow path 3-4 communicatively connects the interior of the crucible 2 to the interior of the arc chamber 7, and provides a path for the chlorine containing gas and the aluminum-containing vapor. The flow path 3-4 leads to apertures H at the end portion 3a of the first nozzle 3. In some embodiments, each aperture H is a round hole that connects the inside and outside of the first nozzle 3 on the front, back, left and right sides of the first nozzle 3, and thus the first nozzle 3 may supply the chlorine containing gas and the aluminum-containing vapor into the arc chamber 7 in four directions. While four apertures are described with respect to FIGS. 1-2, the number of apertures H is not limited to four. In some embodiments, the number of apertures H may be less than four or greater than four. As the number of apertures increase, it may be possible to supply the aluminum-containing vapor to the arc chamber 7 in more directions.

As illustrated in FIG. 6, the insulator 31 may be provided to cover at least a portion of an outside surface of the second portion 3-2 of the first nozzle 3 and may contact an inner surface of the first portion 3-1. The insulator 31 may include projections P that each extend radially outward from a main body MB of the insulator 31.

Figure 7:
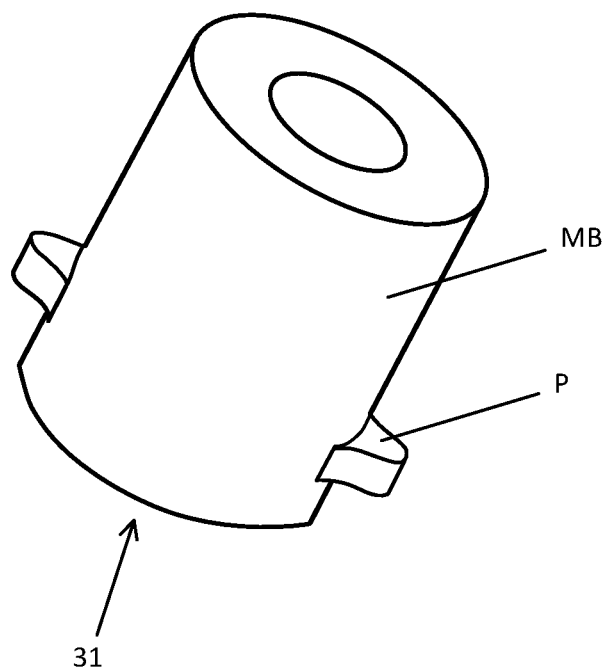
FIG. 7-9 illustrate an example of an insulator, according to some embodiments.
Figure 8:
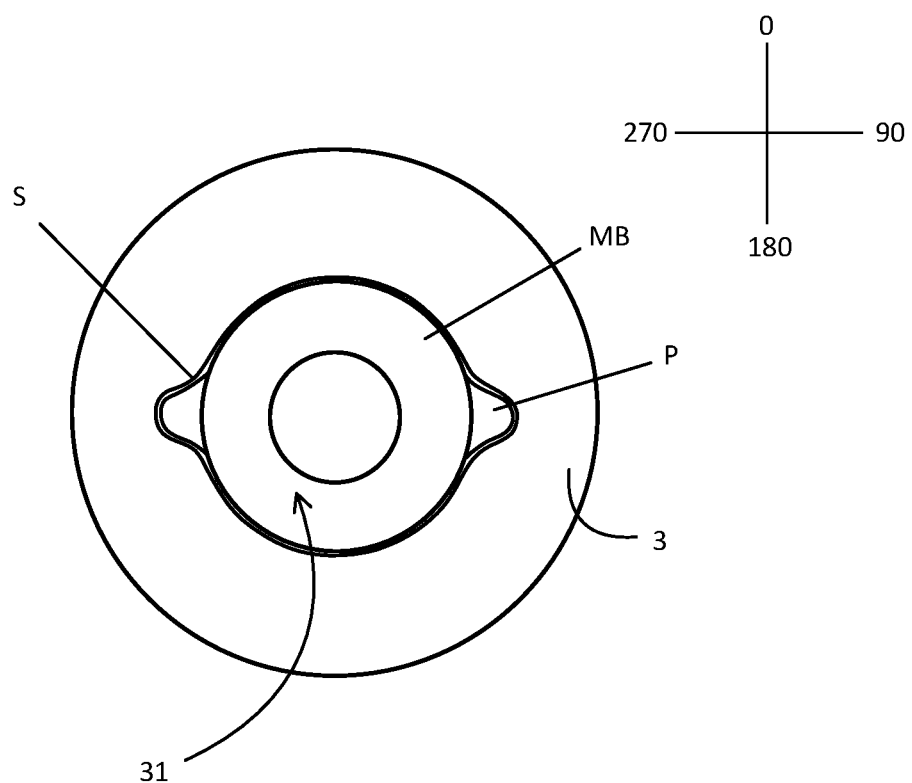
Figure 9:
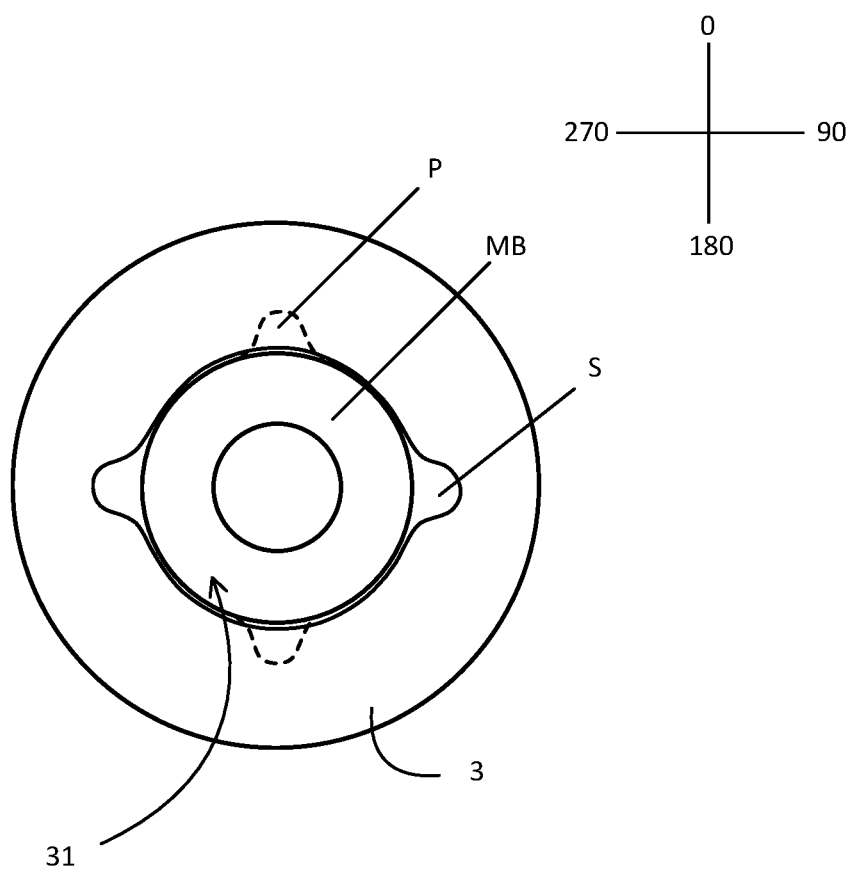

FIG. 7-9 illustrate an example of an insulator, according to some embodiments. FIG. 7 shows a perspective view of the insulator, FIG. 8 illustrates the insulator fitted on the first nozzle before rotation, and FIG. 9 illustrates the insulator fitted on the first nozzle after rotation.

As illustrated in FIGS. 7-9, the insulator 31 may comprise a main body MB that is generally cylindrical, and the projections P that project radially outward from the main body MB at a position along that main body MB that is closer to the crucible 2 than the arc chamber 7 when the insulator 31 is fitted on the first nozzle 3. In some embodiments, two projections P may be provided as illustrated in FIGS. 7-9. However, this is only an example, and in some embodiments, more than two projections P may be provided.

In some embodiments, the first portion 3-1 of the first nozzle may have slots S that extend in an axial direction from an outer edge OE of the first portion 3-1 to the grooves G. The insulator 31 is slid onto the first nozzle 3 in a configuration in which the projections P are matched to the slots S (see FIG. 8) such that the projections P slide among the slots until the groove G is reached. The insulator 31 is then rotated such that the projections P slide circumferentially around the groove G (see FIG. 9) to secure the insulator 31 onto the first nozzle 3 so that the insulator 31 will not slide off the first nozzle 3. For example, as illustrated in FIG. 8, the slots S may be provided at 90 and 270 degrees, and the insulator 31 may be rotated 90 degrees clockwise such the projections P move to from 90 and 270 degrees in FIG. 8 to 0 and 180 degrees in FIG. 9 to secure the insulator 31 onto the first nozzle 3. In some embodiments, the groove G may be provided in two arc segments, one arc segment extending from 270 to 0 degrees and another arc segment extending from 90 to 180 degrees. However, this configuration of the groove G is only an example, and in some embodiments, the groove G may be an annular groove that extends 360 degrees around the first nozzle 3 and in other embodiments, the arc segments may be provided between different circumferential angles as long as the projections P of the insulator 31 may be rotated into place within the groove G to secure the insulator 31 onto the first nozzle 3.

Figure 10:
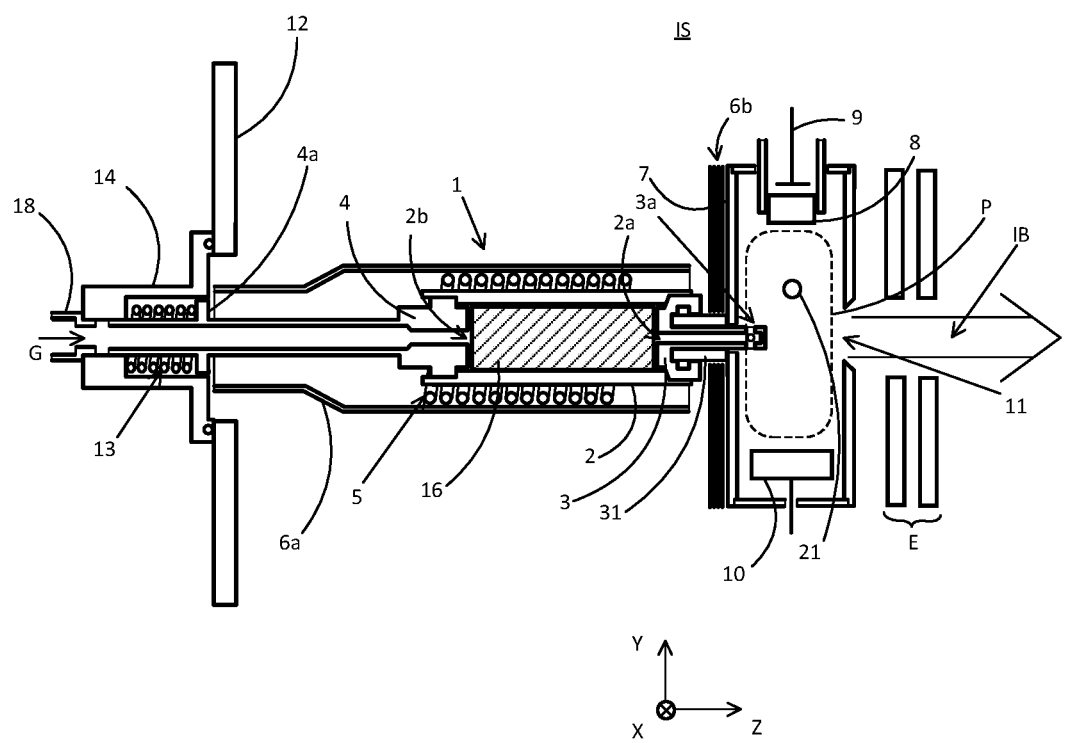
FIGS. 10-17 illustrate schematic cross-sectional views of examples of an ion source, according to various embodiments.

FIG. 10 is a schematic cross-sectional view of an example of an ion source, according to some embodiments. In FIG. 10, like reference numbers refer to like elements in FIGS. 1-9 and a repeated description thereof is omitted for conciseness.

As discussed above with reference to FIG. 1, as the heat transfer from the arc chamber 7 to the end of the crucible 2 occurs near the arc chamber 7, there may be a large temperature difference from one end of the crucible 2 to the other end of the crucible 2 such that it becomes difficult to achieve a stable vapor supply from the vaporizer 1 to the arc chamber 7. In some embodiments, the ion source IS may include both an insulator 31 that is provided to surround the first nozzle 3 that supplies the aluminum-containing vapor to the arc chamber 7 and the second heat shield 6b as illustrated in FIG. 10. Accordingly, in the configuration with both the insulator 31 and the second heat shield 6b, the temperature difference may be further suppressed as compared with an ion source that uses only one temperature difference suppression component.

Figure 11:
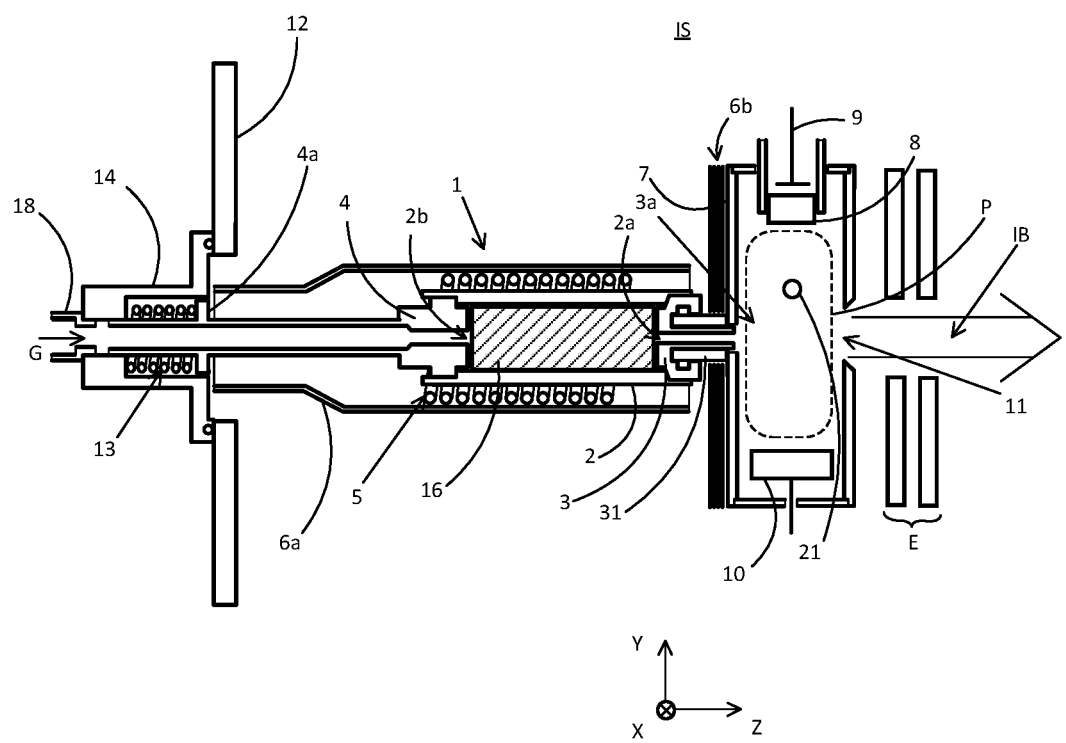

FIG. 11 is a schematic cross-sectional view of an example of an ion source, according to some embodiments. In FIG. 11, like reference numbers refer to like elements in FIGS. 1-10 and a repeated description thereof is omitted for conciseness. In some embodiments, an ion source IS may include both the insulator 31 and the second heat shield 6b, and the insulator 31 may be provided to surround the first nozzle 3 which has the end portion 3a that is flush with the wall of the arc chamber 7, as illustrated in FIG. 11.

Figure 12:
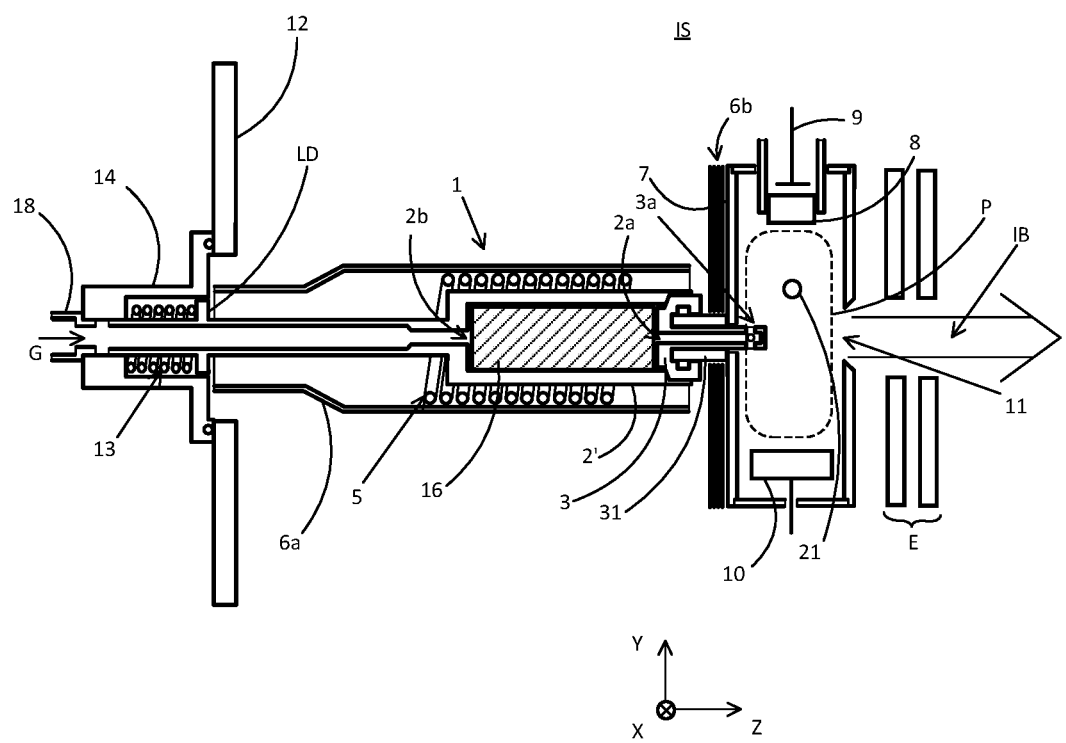

FIG. 12 is a schematic cross-sectional view of an example of an ion source, according to some embodiments. In FIG. 12, like reference numbers refer to like elements in FIGS. 1-11 and a repeated description thereof is omitted for conciseness.

In some embodiments, an ion source IS may be provided with a crucible 2'. In the example discussed above with respect to FIG. 1, the ion source IS includes the crucible 2, the first nozzle 3 and the second nozzle 4 provided as separate components. However, this is only an example and, in some embodiments, the second nozzle 4 may be omitted and the ion source IS may be provided with a crucible 2' which integrates the functionality of the second nozzle 4 into a one body crucible as illustrated in FIG. 12. That is, the crucible 2' may include a first portion to which the first nozzle 3 having the insulator 31 is attached and a second portion which includes the aluminum-containing material 16, and a third portion located on the opposite end of the crucible 2' from the first nozzle 3 and that extends in the –Z axis direction to the gas supply end of the ion source IS. In this configuration, the supply of chlorine containing gas G to the crucible 2' may be done through the gas source inlet 18 fitted inside of the third portion, and the crucible 2' may have a large diameter section LD. The flange 14 may be provided to attach the vaporizer 1 to the ion source flange 12, and the coil spring 13 may be provided between the flange 14 and the large diameter section LD of the crucible 2'. The coil spring 13 forces vaporizer 1 against a side wall of the arc chamber 7 to prevent aluminum-containing vapor and/or chlorine containing gas from leaking out between the first nozzle 3 and the arc chamber 7. In some embodiments, one or more gaskets (not shown) may also be provided between the vaporizer 1 and the side wall of the arc chamber 7 to prevent gas leakage between the first nozzle 3 and the arc chamber 7, and/or one or more gaskets (not shown) may be provided between the vaporizer 1 and the second heat shield 6b to prevent gas leakage between the vaporizer 1 and the second heat shield 6b. In some embodiments, a damper, for example, a spring clip in the form of a snap ring, may be attached to the first nozzle 3 in order to avoid excess pressure by the elastic force of the coil spring 13. In still other embodiments, a damper, for example, a spring clip, may be provided between the large diameter section LD of the second nozzle 4 and the inner wall of the first heat shield 6a in order to prevent the excess pressure by the elastic force of the coil spring 13. In some embodiments, one or all of one or more gaskets, a snap ring, and/or a spring clip may be provided. It is noted that the gaskets, snap ring and spring clip are only examples and, in other embodiments, different or additional structures may be used. The ion source flange 12 also indirectly supports the arc chamber 7 and other components around the arc chamber 7 such as the filament 9 and the cathode 8 by supporting parts not shown in FIG. 12.

As discussed above with reference to FIG. 1, as the heat transfer from the arc chamber 7 to the end of the crucible 2 occurs near the arc chamber 7, there may be a large temperature difference from one end of the crucible 2 to the other end of the crucible 2 such that it becomes difficult to achieve a stable vapor supply from the vaporizer 1 to the arc chamber 7. When the second nozzle 4 is provided as a separate component, the second nozzle 4 tends to absorb heat that is generated by the coil heater 5 at the gas supply side of the crucible 2. In the configuration having the crucible 2' which is provided as one body and omits the second nozzle 4, more heat may be provided by the coil heater 5 to the end of the crucible 2' near the gas supply side of the crucible 2' as compared with the configuration illustrated in FIG. 1 and thus the temperature difference may be further suppressed as compared with an ion source that uses the crucible 2, the first nozzle 3, and the second nozzle 4 provided as separate components.

Figure 13:
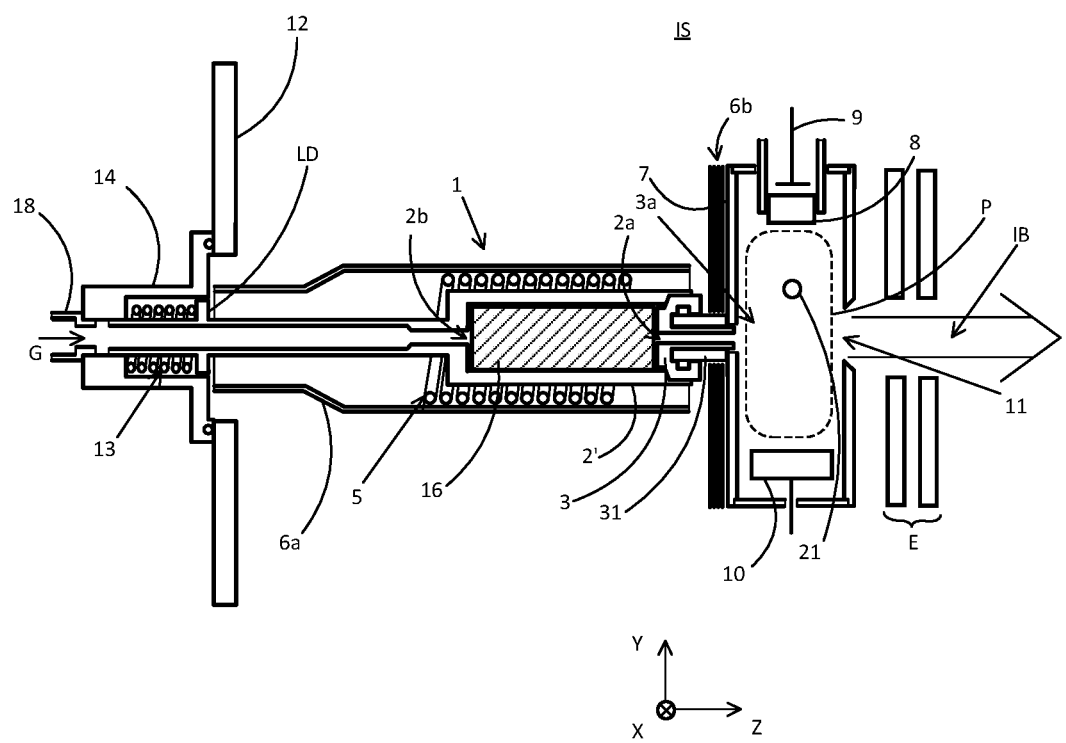

FIG. 13 is a schematic cross-sectional view of an example of an ion source, according to some embodiments. In FIG. 13, like reference numbers refer to like elements in FIGS. 1-12 and a repeated description thereof is omitted for conciseness. In some embodiments, an ion source IS may include the insulator 31, the second heat shield 6b, and the crucible 2', and the insulator 31 may be provided to surround the first nozzle 3 which has the end portion 3a that is flush with the wall of the arc chamber 7, as illustrated in FIG. 13.

Figure 14:
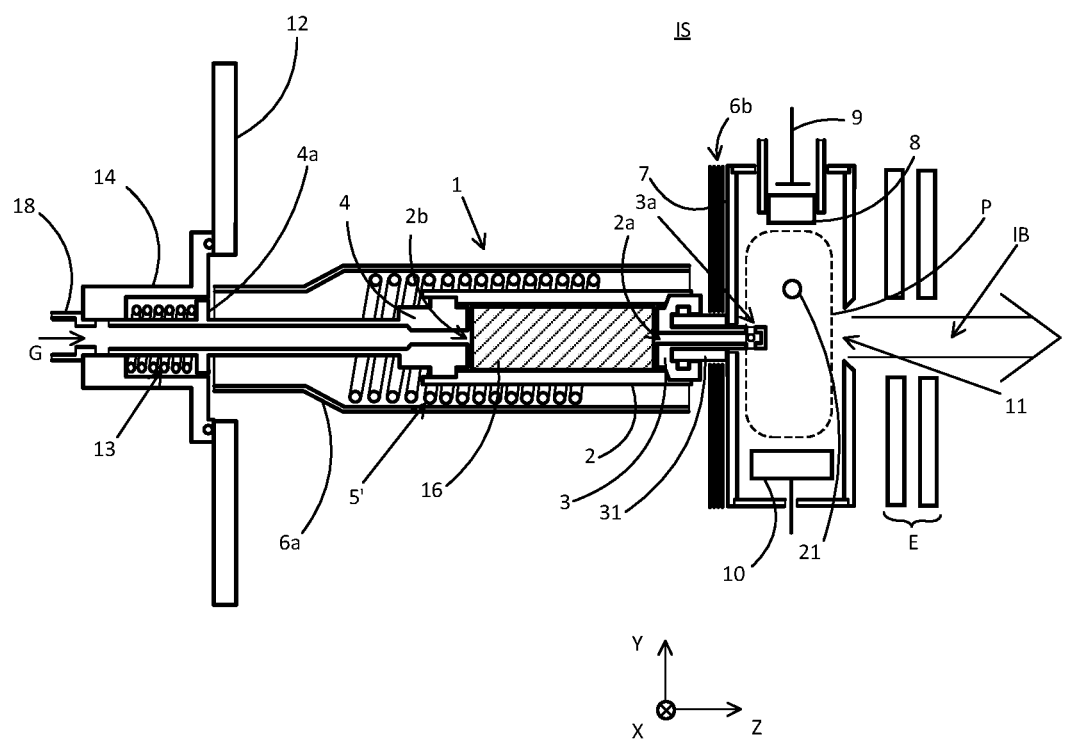

FIG. 14 is a schematic cross-sectional view of an example of an ion source, according to some embodiments. In FIG. 14, like reference numbers refer to like elements in FIGS. 1-13 and a repeated description thereof is omitted for conciseness.

As illustrated in FIG. 14, an ion source IS according to some embodiments may include the second heat shield 6b, the insulator 31, and a coil heater 5'. The coil heater 5' may have a thermocouple and may be wound around a portion of a periphery of the crucible 2 but may be shifted toward the gas supply side of the ion source IS. In some embodiments, the crucible 2 may be cylindrical and extend in a longitudinal direction, and may have an arc-side portion at an end of the crucible 2 to which the first nozzle 3 is attached and an inlet-side portion at an end of the crucible 2 to which the second nozzle 4 is attached. In some embodiments, the coil heater 5' may surround an exterior surface of the inlet-side portion of the crucible 2 but is not disposed around the exterior surface of the arc-side portion of the crucible 2. In some embodiments, the coil heater 5' may extend in the longitudinal direction beyond the proximal end of the crucible 2.

As discussed above, during operation of the ion source IS in the example illustrated with respect to FIG. 1, as the heat transfer from the arc chamber 7 to the end of the crucible 2 occurs near the arc chamber 7, the temperature within the crucible 2 may vary from an ion source end of the crucible 2 (i.e., an end at which the second nozzle 4 is provided) to an opposite end (arc chamber end) of the crucible 2 (i.e., an end at which the first nozzle 3 is provided) due to heat that is generated by the arc chamber 7 and transferred to an end of the crucible 2 near the arc chamber 7, such that the variance of the temperature from one end of the crucible 2 to the other end of the crucible 2 causes the vapor supply from the vaporizer 1 to the arc chamber 7 to become unstable. In some embodiments, the coil heater 5' may be moved further proximally toward the gas supply side of the ion source IS as illustrated in FIG. 14. In this configuration, less heat may be generated at the end of the crucible 2 that is close to the arc chamber 7 and the coil heater 5' may generate heat in a same or greater amount as in the coil heater 5, at the end of the crucible 2 near the gas supply side of the ion source IS. Thus, the large temperature difference may be suppressed. For example, coils of the coil heater 5' may be not be provided to surround a portion of the crucible 2 that is near the arc chamber 7, and this portion may be heated by the heat that is generated by the arc chamber 7 and transferred to the crucible 2, and coils of the coil heater 5' may be provided to surround a remaining portion of the crucible 2 that is near the gas supply side of the ion source IS to heat the remaining portion so that the temperature across the crucible 2 becomes more consistent and stable.

Figure 15:
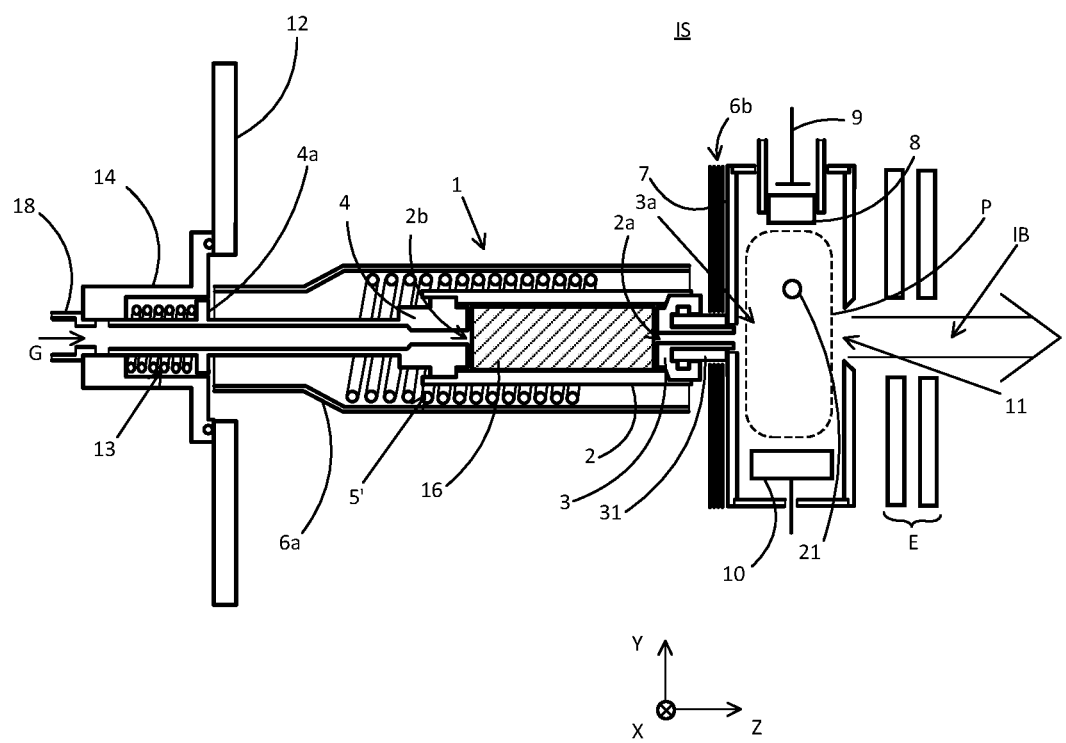

FIG. 15 is a schematic cross-sectional view of an example of an ion source, according to some embodiments. In FIG. 15, like reference numbers refer to like elements in FIGS. 1-14 and a repeated description thereof is omitted for conciseness. In some embodiments, an ion source IS may include the insulator 31, the second heat shield 6b, and coil heater 5', and the insulator 31 may be provided to surround the first nozzle 3 which has the end portion 3a that is flush with the wall of the arc chamber 7, as illustrated in FIG. 15.

Figure 16:
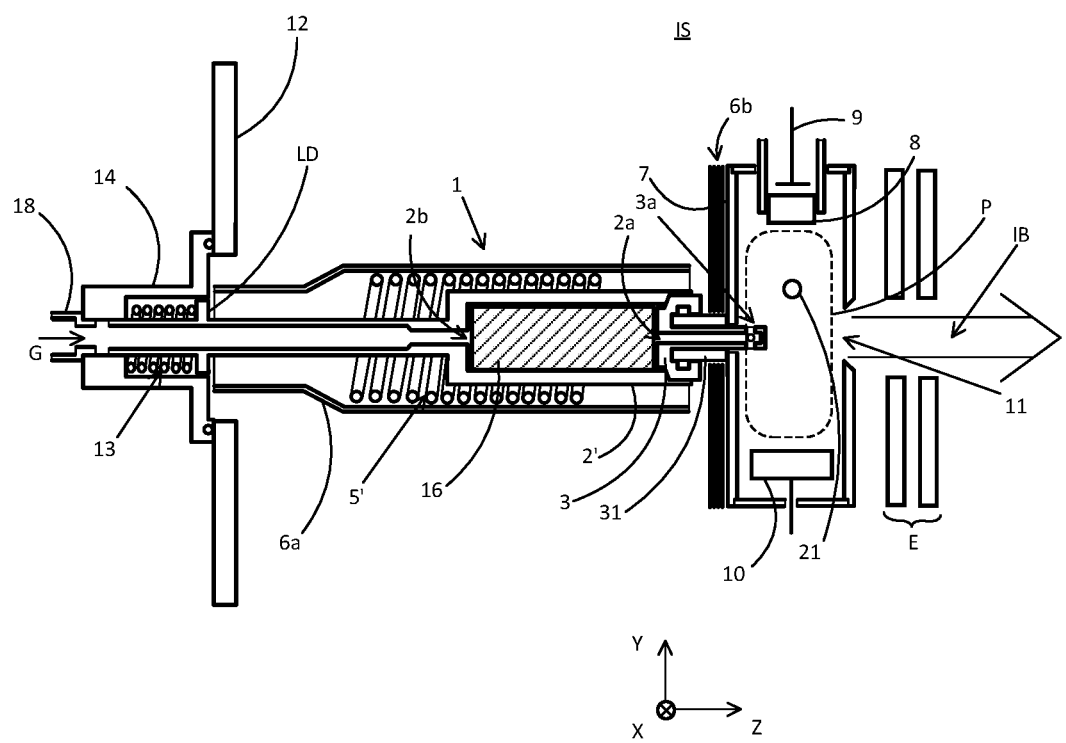

FIG. 16 is a schematic cross-sectional view of an example of an ion source, according to some embodiments. In FIG. 16, like reference numbers refer to like elements in FIGS. 1-15 and a repeated description thereof is omitted for conciseness.

As discussed above with reference to FIG. 1, as the heat transfer from the arc chamber 7 to the end of the crucible 2 occurs near the arc chamber 7, there may be a large temperature difference from one end of the crucible 2 to the other end of the crucible 2 such that it becomes difficult to achieve a stable vapor supply from the vaporizer 1 to the arc chamber 7. In some embodiments, the ion source IS may include the insulator 31, the second heat shield 6b, the coil heater 5', and the crucible 2', as illustrated in FIG. 16.

Accordingly, in the configuration combining the insulator 31, the second heat shield 6b, the coil heater 5', and the crucible 2', the temperature difference may be further suppressed as compared with an ion source that uses a portion of these components.

Figure 17:
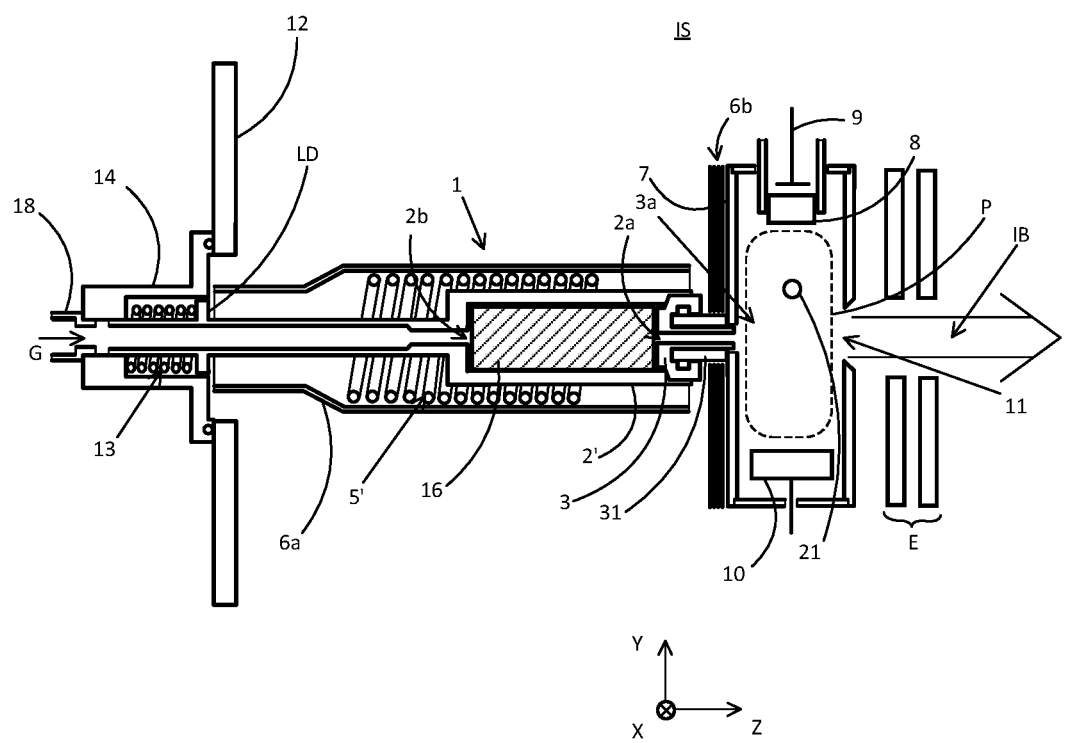

FIG. 17 is a schematic cross-sectional view of an example of an ion source, according to some embodiments. In FIG. 17, like reference numbers refer to like elements in FIGS. 1-16 and a repeated description thereof is omitted for conciseness. In some embodiments, an ion source IS may include the insulator 31, the second heat shield 6b, coil heater 5', and the crucible 2', and the insulator 31 may be provided to surround the first nozzle 3 which has the end portion 3a that is flush with the wall of the arc chamber 7, as illustrated in FIG. 17.

In the ion source according to various embodiments discussed herein, thermal uniformity of the vaporizer 1 and, specifically, the crucible 2, may be improved by over 60%. For example, in a simulation of the ion source illustrated in FIGS. 16 and 17, the temperature difference was about 50 degrees C. Thus, in the ion source according to some embodiments, heat control is more precise. It should be understood that embodiments are not limited to the various embodiments described above, but various other changes and modifications may be made therein without departing from the spirit and scope thereof as set forth in appended claims.

What is claimed is:

1. An ion source comprising:
 a vaporizer comprising:
  a crucible containing an aluminum-containing material, the crucible comprising a gas inlet and a vapor outlet; and
  a heater configured to heat the crucible;
 an arc chamber configured to generate a plasma therein; and
 a heat shield,
 wherein the vapor outlet is configured to output vapor into the arc chamber through a wall of the arc chamber, and
 wherein the heat shield is provided between the vaporizer and the wall of the arc chamber.

2. The ion source as recited in claim 1, wherein the heat shield comprises a plurality of plates that extend parallel to the wall of the arc chamber,
 wherein the plurality of plates are spaced apart from each other.

3. The ion source as recited in claim 1, wherein the vaporizer further comprises a first nozzle that is configured to be attached to a distal end of the crucible, and an insulator that surrounds at least a portion of the first nozzle, and
 wherein the first nozzle comprises a flow path through which the vapor flows from the vapor outlet of the crucible into the arc chamber.

4. The ion source as recited in claim 3, wherein the first nozzle comprises an end portion that extends through the wall of the arc chamber, the end portion comprising a plurality of holes at a distal end thereof.

5. The ion source as recited in claim 3, further comprising a gas source inlet,
 wherein the vaporizer further comprises a second nozzle that is configured to be attached to a proximal end of the crucible, the second nozzle being disposed between the gas source inlet and the gas inlet and being in fluid communication with both the gas source inlet and the gas inlet.

6. The ion source as recited in claim 5, wherein the crucible is cylindrical and extends in a longitudinal direction,
the crucible has an arc-side portion at an end of the crucible to which the first nozzle is attached and an inlet-side portion at an end of the crucible to which the second nozzle is attached,
the heater comprises a coil heater, and
the coil heater is disposed around an exterior surface of the inlet-side portion of the crucible but is not disposed around the arc-side portion of the crucible.

7. The ion source as recited in claim 6, wherein the coil heater extends in the longitudinal direction beyond a proximal end of the second nozzle.

8. The ion source as recited in claim 6, wherein the first nozzle comprises an end portion that extends through the wall of the arc chamber, the end portion comprising a plurality of holes at a distal end thereof.

9. The ion source as recited in claim 3, further comprising a gas source inlet,
wherein the crucible includes a first portion to which the first nozzle is attached, a second portion containing the aluminum-containing material, and a third portion that extends from a proximal end of the second portion in a longitudinal direction to a proximal end of the ion source, and
the gas source inlet is in fluid communication with the third portion.

10. The ion source as recited in claim 9, wherein the first nozzle comprises an end portion that extends through the wall of the arc chamber, the end portion comprising a plurality of holes at a distal end thereof.

11. The ion source as recited in claim 9, wherein the crucible is cylindrical and extends in a longitudinal direction,
the second portion of the crucible has an arc-side portion at a distal end thereof and an inlet-side portion at the proximal end thereof,
the heater comprises a coil heater, and
the coil heater is disposed around an exterior surface of the inlet-side portion of the crucible but is not disposed around the arc-side portion of the crucible.

12. The ion source as recited in claim 11, wherein the coil heater extends in the longitudinal direction beyond the proximal end of the second portion and surrounds a part of the third portion of the crucible.

13. The ion source as recited in claim 11, wherein the first nozzle comprises an end portion that extends through the wall of the arc chamber, the end portion comprising a plurality of holes at a distal end thereof.

14. The ion source as recited in claim 1, wherein the aluminum-containing material substantially fills an interior of the crucible.

15. The ion source as recited in claim 14, wherein the aluminum-containing material comprises aluminum powder, aluminum pellets, or a porous aluminum block.

16. An ion source comprising:
a vaporizer comprising:
a crucible containing an aluminum-containing material that substantially fills an interior of the crucible, the crucible comprising a gas inlet and a vapor outlet; and
a heater configured to heat the crucible; and
an arc chamber configured to generate a plasma therein, wherein the vapor outlet is configured to output vapor into the arc chamber through a wall of the arc chamber.

17. The ion source as recited in claim 16, wherein the aluminum-containing material comprises aluminum powder, aluminum pellets, or a porous aluminum block.

18. The ion source as recited in claim 16, further comprising a heat shield,
wherein the heat shield is provided between the vaporizer and the wall of the arc chamber.

19. The ion source as recited in claim 18, wherein the vaporizer further comprises a first nozzle that is configured to be attached to a distal end of the crucible, and an insulator that surrounds at least a portion of the first nozzle, and
wherein the first nozzle comprises a flow path through which the vapor flows from the vapor outlet of the crucible into the arc chamber.

20. An ion source comprising:
a gas source inlet;
a vaporizer comprising:
a crucible comprising a gas inlet and a vapor outlet, the crucible being cylindrical and extending in a longitudinal direction;
a first nozzle that is attached to a distal end of the crucible;
an insulator that surrounds at least a portion of the first nozzle, and
a coil heater configured to heat the crucible;
an arc chamber configured to generate a plasma therein; and
a heat shield,
wherein the first nozzle comprises a flow path through which a vapor flows from the vapor outlet of the crucible into the arc chamber,
the heat shield is provided between the vaporizer and a wall of the arc chamber,
the crucible includes a first portion to which the first nozzle is attached, a second portion containing an aluminum-containing material, and a third portion that extends from a proximal end of the second portion in the longitudinal direction to a proximal end of the ion source, and the gas source inlet is in fluid communication with the third portion,
the second portion of the crucible has an arc-side portion at a distal end thereof and an inlet-side portion at the proximal end thereof, and
the coil heater is disposed around an exterior surface of the inlet-side portion of the crucible and extends in the longitudinal direction beyond the proximal end of the second portion to surround a part of the third portion of the crucible but is not disposed around the arc-side portion of the crucible.

* * * * *